(12) United States Patent
Mao et al.

(10) Patent No.: US 9,553,218 B2
(45) Date of Patent: Jan. 24, 2017

(54) HIGH TRANSMITTANCE THIN FILM SOLAR PANEL

(71) Applicant: NEXPOWER TECHNOLOGY CORPORATION, Taichung (TW)

(72) Inventors: Chih-Jen Mao, Taichung (TW);
Jia-Shian Lin, Taichung (TW);
Sheng-Jui Lee, Taichung (TW);
Chi-Shan Huang, Taichung (TW);
Chih-Wei Chang, Taichung (TW)

(73) Assignee: NEXPOWER TECHNOLOGY CORPORATION, Taichung (TW)

( * ) Notice: Subject to any disclaimer, the term of this patent is extended or adjusted under 35 U.S.C. 154(b) by 47 days.

(21) Appl. No.: 14/446,405

(22) Filed: Jul. 30, 2014

(65) Prior Publication Data
US 2015/0136222 A1 May 21, 2015

(30) Foreign Application Priority Data
Nov. 25, 2013 (TW) .............................. 102142876 A

(51) Int. Cl.
*H01L 31/00* (2006.01)
*H01L 31/0224* (2006.01)
(Continued)

(52) U.S. Cl.
CPC .............. *H01L 31/022433* (2013.01); *H01L 31/022466* (2013.01); *H01L 31/022475* (2013.01);
(Continued)

(58) Field of Classification Search
CPC .................. H01L 31/02363; H01L 31/022433;
H01L 31/03923; H01L 31/022466; H01L 31/022475; H01L 31/022491; H01L 31/046; H01L 31/0468; H01L 31/022483
(Continued)

(56) References Cited

U.S. PATENT DOCUMENTS

2011/0265841 A1* 11/2011 Lee .................... H01L 31/0749
136/244
2012/0211060 A1* 8/2012 Ahn ................ H01L 31/022433
136/251

(Continued)

*Primary Examiner* — Tamir Ayad
*Assistant Examiner* — Uyen Tran
(74) *Attorney, Agent, or Firm* — Lin & Associates Intellectual Property, Inc.

(57) ABSTRACT

A high transmittance thin film solar panel includes a transparent substrate, a front electrode layer, a light absorption layer and a rear electrode layer. The light absorption layer is formed with opening patterns with the same width at positions aligned correspondingly to form at least one first opening trench, a plurality of second opening trenches with continuously and periodically sinusoidal-wave shape, and a plurality of third opening trenches parallel to, interlace with or superpose the second opening trenches, and extend in a direction orthogonal to the direction of the first opening trench. The high transmittance thin film solar panel of the present invention is mainly used for green buildings. The opening trenches of the high transmittance thin film solar panel are formed in a manner of curve shape by an oscillating laser head, and can enhance the transmittance by more than about 3% in comparison with the conventional one.

5 Claims, 4 Drawing Sheets

(51) Int. Cl.
  *H01L 31/046*   (2014.01)
  *H01L 31/0468*   (2014.01)

(52) U.S. Cl.
  CPC ............... *H01L 31/022483* (2013.01); *H01L 31/022491* (2013.01); *H01L 31/046* (2014.12); *H01L 31/0468* (2014.12); *Y02B 10/10* (2013.01); *Y02E 10/50* (2013.01)

(58) Field of Classification Search
  USPC ................................................ 136/256, 252
  See application file for complete search history.

(56) References Cited

U.S. PATENT DOCUMENTS

2012/0291853 A1\* 11/2012 Lee ................. H01L 31/022466
                     136/249
2015/0214409 A1\* 7/2015 Pfeiffer ............... H01L 31/0463
                     136/249

\* cited by examiner

HIGH TRANSMITTANCE THIN FILM SOLAR PANEL

CROSS-REFERENCES TO RELATED APPLICATION

This application claims the priority of Taiwanese patent application No. 102142876, filed on Nov. 25, 2013, which is incorporated herewith by reference.

BACKGROUND OF THE INVENTION

1. Field of the Invention

The present invention relates to a high transmittance thin film solar panel. Particularly, the present invention relates to a thin film solar panel having continuously and periodically sinusoidal-wave-shaped trenches to enhance the light transmittance thereof, and the solar panel is suitable for construction use.

2. The Prior Art

Solar panel, which can convert sun light into electric energy, is a kind of green energy and is urgently needed to be developed since the resource from the Earth is gradually running out. In regard to green buildings, governments around the world are broadly assisting to promote the solar panel to be widespread nowadays. Generally, solar panels are mounted on house roofs, courtyards and the patio of a building. However, solar panels usually include opaque materials, like silicon crystals and rear electrode layers, which result in light shielding and heat absorbing. As a result, when use indoor, light and air conditioners are required to be switched on to compensate for the foregoing drawbacks, thereby contrarily degrading the effect of saving energy of the green buildings.

Accordingly, solar panel design for enhancing the light transmittance has become a crucial issue. In most cases, there are two approaches at present for it: one is reducing the area of photoelectric conversion units, which is a controversial issue over the converted energy and the costs of purchasing and setting. The other, which is mostly adopted, is to improve the pattern design to enlarge the light transmitting area. The improved designs include removing part of rear electrode layer, photoelectric conversion layer, and front electrode layer to form a plurality of light transmitting openings or to form trenches. However, the light transmittance is still not enough and the problem of pattern damage from high temperature by electricity stored at sharp ends may easily occur. Therefore, a thin film solar panel that can enhance the light transmittance and solve the foregoing problems as well is needed urgently.

SUMMARY OF THE INVENTION

The main purpose of the present invention is to provide a high transmittance thin film solar panel. The high transmittance thin film solar panel, in a direction of incident light, successively includes a transparent substrate, a front electrode layer, a light absorption layer and a rear electrode layer. The front electrode layer is formed with at least one first opening pattern and a plurality of seventh opening patterns, wherein the first opening pattern continuously extends in a first direction and defines at least one first separation line. The light absorption layer is disposed on the front electrode layer, covers the first separation line, and is formed with at least one second opening pattern, at least one third opening pattern, a plurality of fifth opening patterns and a plurality of eighth opening patterns, wherein the second opening pattern and the third opening pattern are parallel to the first opening pattern and extend in the first direction, and the second opening pattern defines at least one second separation line.

The rear electrode layer is disposed on the light absorption layer, covers the second separation line, and is formed with at least one fourth opening pattern, a plurality of sixth opening patterns and a plurality of ninth opening patterns, wherein the fourth opening pattern extends in the first direction, the fourth opening pattern and the third opening pattern have the same width, superpose each other at the same position and cooperatively define at least one opening trench.

The fifth opening patterns and the sixth opening patterns have the same width, superpose one another at the same position and cooperatively define a plurality of second opening trenches. The second opening trenches are continuously and periodically sinusoidal-wave-shaped curves, and extend in a second direction orthogonal to the first direction with amplitude of 10 μm-10 mm and period of 5 μm-500 mm each. The second opening trenches are parallel to and adjacent to each other, and phases of waveforms of two adjacent second opening trenches are in-phase, shifted or 180°-out-of-phase. The seventh opening patterns, the eighth opening patterns and the ninth opening patterns, have the same width and superpose one another at the same position, continuously extend and cooperatively define a plurality of third opening trenches. The third opening trenches extend in the second direction, and the second opening trenches are parallel to, interlace with or superpose one another. The light absorption layer is divided into a plurality of areas by the first opening trench, the second opening trenches and the third opening trenches.

The high transmittance thin film solar panel of the present invention is mainly used for green buildings. The opening trenches of the high transmittance thin film solar panel which are formed in a manner of curve shape by an oscillating laser head, and can enhance the light transmittance by more than about 3% in comparison with the conventional one. Such a high transmittance thin film solar panel as used to be the material of photoelectric conversion can enhance the indoor lighting and can be broadly adopted for commercial use.

DETAILED DESCRIPTION OF THE PREFERRED EMBODIMENTS

Hereinafter, reference will now be made in detail to the exemplary embodiments of the present invention, examples of which are illustrated in the accompanying drawings. A person ordinarily skilled in the art can carry out the present invention according to the specification after studying the specification of the present invention.

Figure 1:
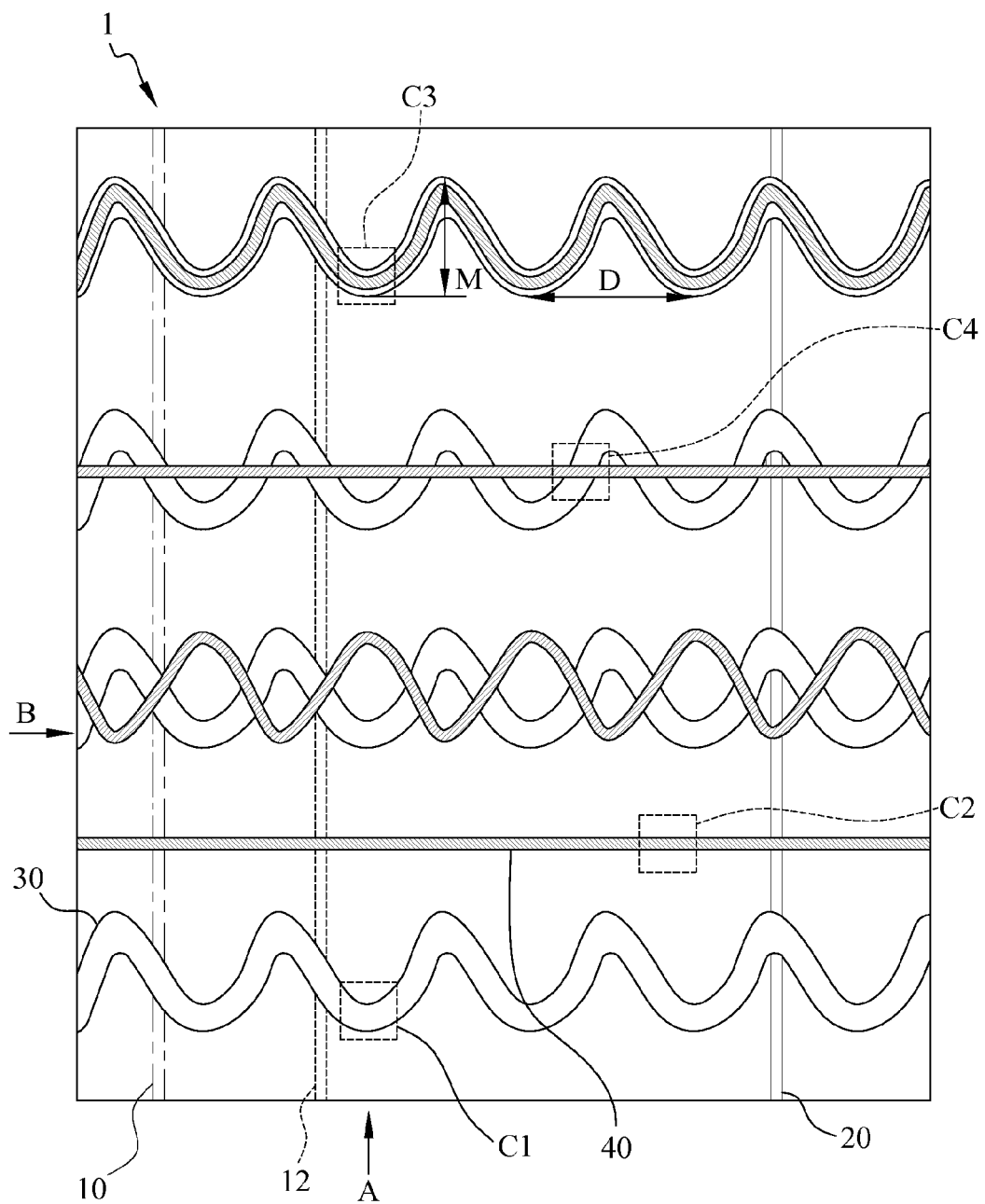
FIG. 1 is a schematic top view of a high transmittance thin film solar panel of the present invention.
Figure 2:
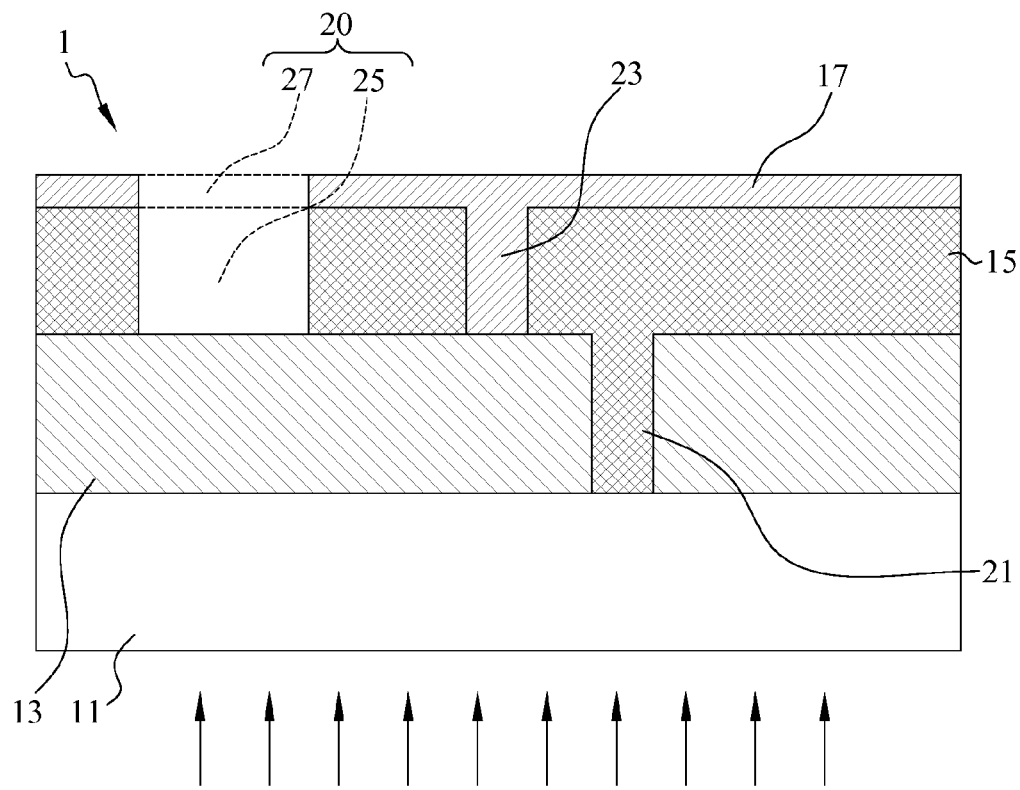
FIG. 2 is a cross-sectional view of the high transmittance thin film solar panel of the present invention taken in a direction A illustrated in FIG. 1.

FIG. 1 is a schematic top view of a high transmittance thin film solar panel of the present invention and FIG. 2 is a cross-sectional view of the high transmittance thin film solar panel of the present invention taken in a direction A illustrated in FIG. 1. As shown in FIGS. 1 and 2, the high transmittance thin film solar panel 1 of the present invention is produced by successively stacking a transparent substrate 11, a front electrode layer 13, a light absorption layer 15, and a rear electrode layer 17 from the side of incident light illuminating the high transmittance thin film solar panel 1. The front electrode layer 13 having at least one first opening pattern 21 is disposed on the transparent substrate 11, and the first opening pattern 21 extends in the direction A and defines at least one first separation line 10. The light absorption layer 15 is disposed on the front electrode layer 13 and covers the first separation line 10. The light absorption layer 15 is formed with at least one second opening pattern 23 and at least one third opening pattern 25. The second opening pattern 23 and the third opening pattern 25 are parallel to the first opening pattern 21, and continuously extend in the direction A. The second opening pattern 23 defines at least one second separation line 12. The rear electrode layer 17 is disposed on the light absorption layer 15 and covers the second opening pattern 23. The rear electrode layer 17 is formed with at least one fourth opening pattern 27, which has a width equivalent to the width of the third opening pattern 25 and which superposes the third opening pattern 25. The fourth opening pattern 27 continuously extends in the direction A and defines at least one first opening trench 20 along with the third opening pattern 25 in the direction A.

Figure 3A:
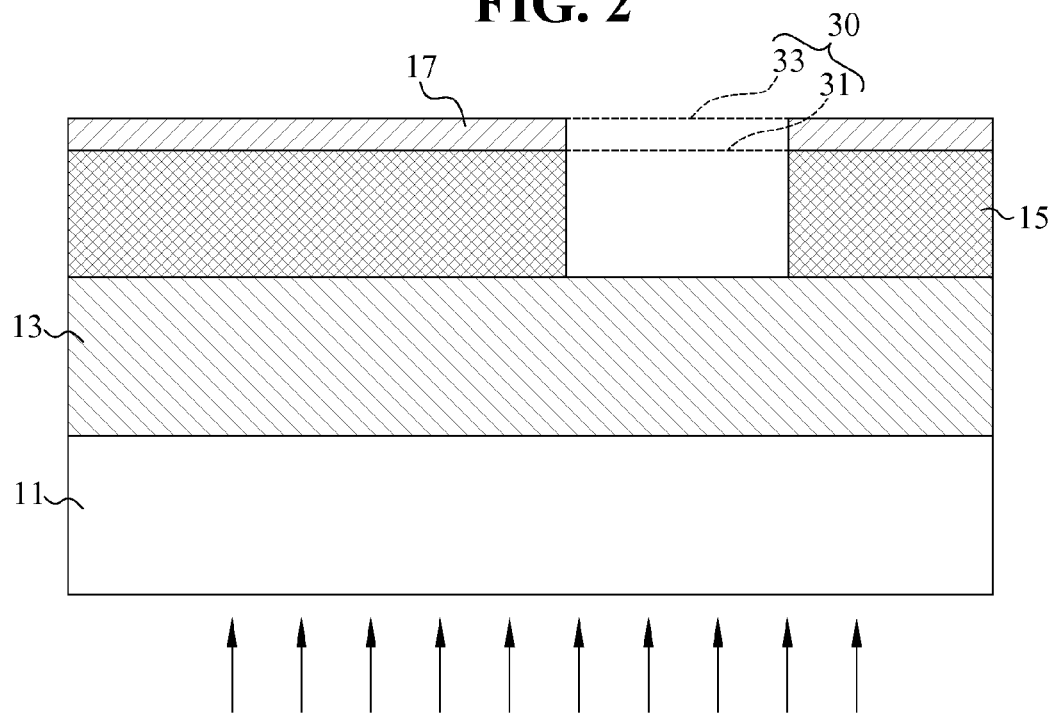
FIG. 3A is a cross-sectional view of an area C1 illustrated in FIG. 1.

FIG. 3A is a cross-sectional view of an area C1 illustrated in FIG. 1. As shown in FIGS. 1 and 3A, the light absorption layer 15 and the rear electrode layer 17 further include a plurality of fifth opening patterns 31 and a plurality of sixth opening patterns 33. The fifth opening patterns 31 have the width equivalent to the width of the sixth opening patterns 33 and superpose the six opening patterns 33. The fifth opening patterns 31 continuously extend and cooperatively define a plurality of second opening trenches 30. The second trenches 30 are continuously and periodically sinusoidal-wave-shaped curves, and extend in a second direction B orthogonal to the first direction A, with amplitude of 10 μm-10 mm and period of 5 μm-500 mm each. The second opening trenches 30 are parallel to and adjacent to each other, and phases of waveforms of two adjacent second opening trenches may be in-phase, shifted or 180°-out-of-phase.

Figure 3B:
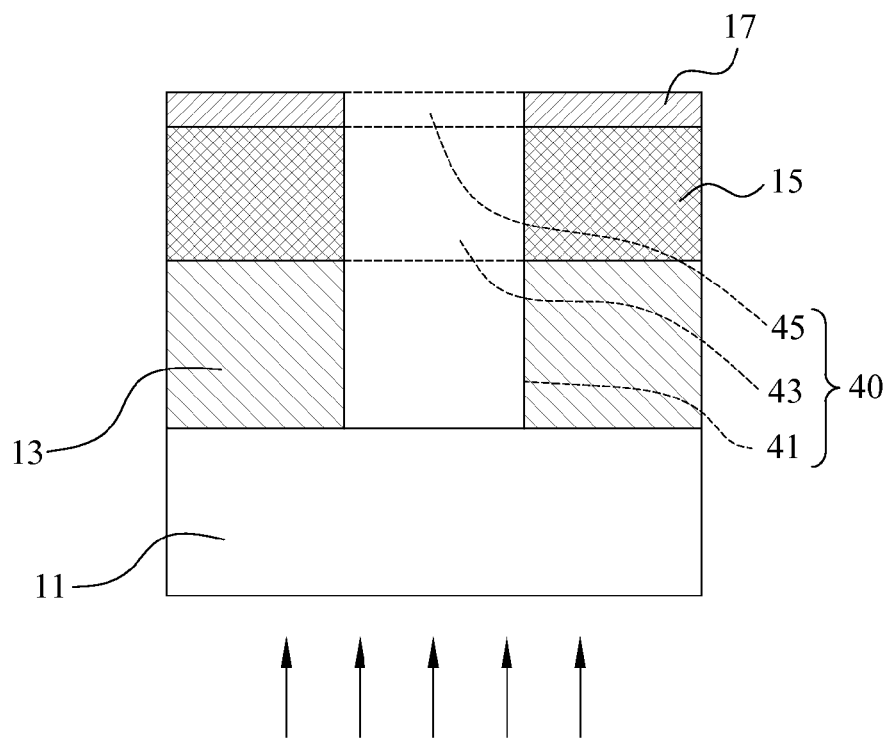
FIG. 3B is a cross-sectional view of an area C2 illustrated in FIG. 1.

FIG. 3B is a cross-sectional view of an area C2 illustrated in FIG. 1. As shown in FIGS. 1 and 3B, the front electrode layer 13, the light absorption layer 15 and the rear electrode layer 17 further include a plurality of seventh opening patterns 41, a plurality of eighth opening patterns 43 and a plurality of ninth opening patterns 45, respectively. The seventh opening patterns 41, the eighth opening patterns 43 and the ninth opening patterns 45 have the same width and superpose one another at the same position. The seventh opening patterns 41, the eighth opening patterns 43 and the ninth opening patterns 45 continuously extend and cooperatively define a plurality of third opening trenches 40. The third opening trenches 40 extend in straight lines, periodically sinusoidal-wave-shaped curves, or triangular-wave-shaped lines, extend in the second direction B orthogonal to the first line A.

The third opening trenches 40 and the second opening trenches 30 may be parallel with, interlace with or superpose one another. The light absorption layer 15 may be divided into a plurality of areas by the first opening trench 20, the second opening trenches 30 and the third opening trenches 40.

The transparent substrate 11 is made from transparent material, such as alkali-free glass, quartz glass and acrylic. The front electrode layer 13 is made from transparent conductive material, such as indium tin oxide and aluminum zinc oxide. The light absorption layer 15 is made from at least one of mono-crystalline silicon, poly-crystalline silicon, micro-crystalline silicon, CuInGaSe thin film, and CuInGaSeS thin film. The rear electrode layer 17 is made from transparent conductive material, such as indium tin oxide and aluminum zinc oxide, and/or metallic material, such as molybdenum, silver and nickel, for reflecting light back to the light absorption layer 15 so as to increase the photoelectric conversion efficiency of the solar panel 1 of the present invention. The second opening trenches 30 are formed by green laser scribing, and the third trenches 40 are formed by infrared laser scribing. As one of the third opening trenches 40 is periodically sinusoidal-wave-shaped, amplitude M thereof may be 10 μm-10 mm, and period D thereof may be 5 μm-500 mm each.

Figure 3C:
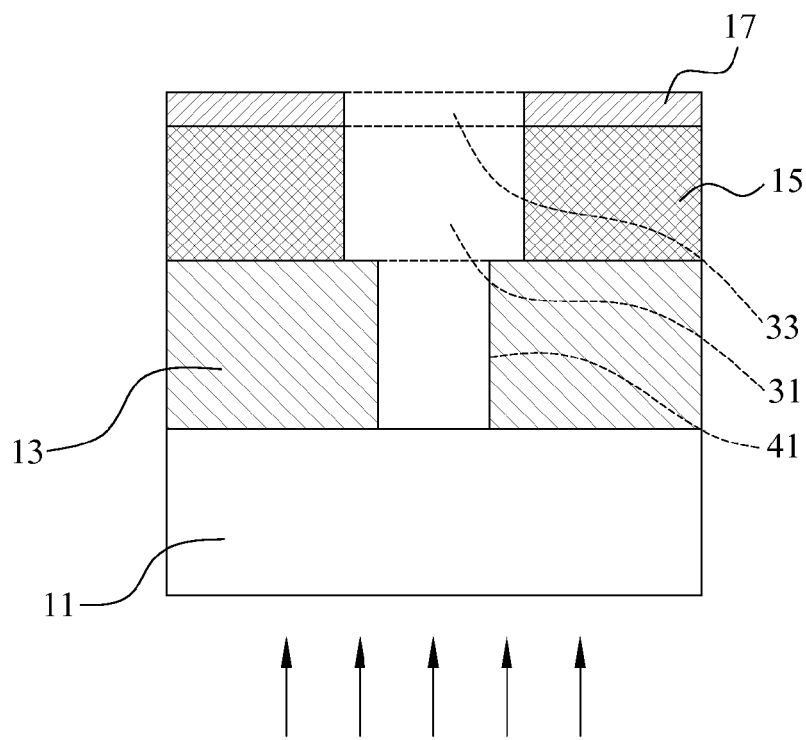
FIGS. 3C, 3D and 3E are schematic cross-sectional views of interlacing or superposing of second opening trenches with third opening trenches in the first, second and third embodiments respectively of the high transmittance thin film solar panel of the present invention.

FIG. 3C is schematic cross-sectional view of interlacing or superposing of the second opening trenches with and the third opening trenches in the first embodiment of the present invention. Referring to FIG. 3C and an area C3 in FIG. 1, when the width of the second opening trenches 30 is longer than the width of the third opening trenches, the cross-sectional structure as shown in FIG. 3C is formed such that the width of the seventh opening patterns 41 is shorter than the width of the fifth opening patterns 31 and the width of the sixth opening patterns 33.

Figure 3D:
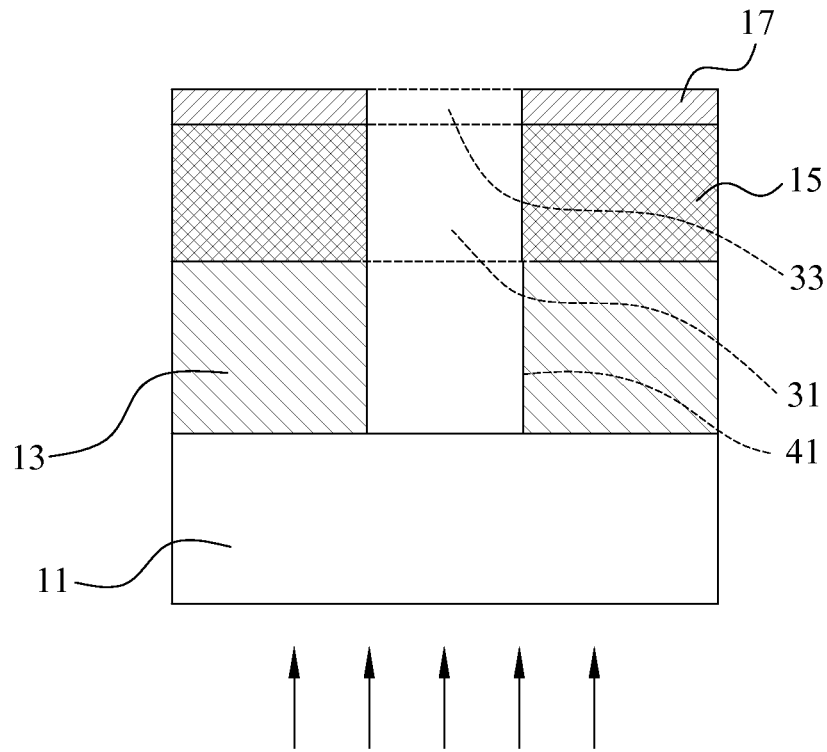
Figure 3E:
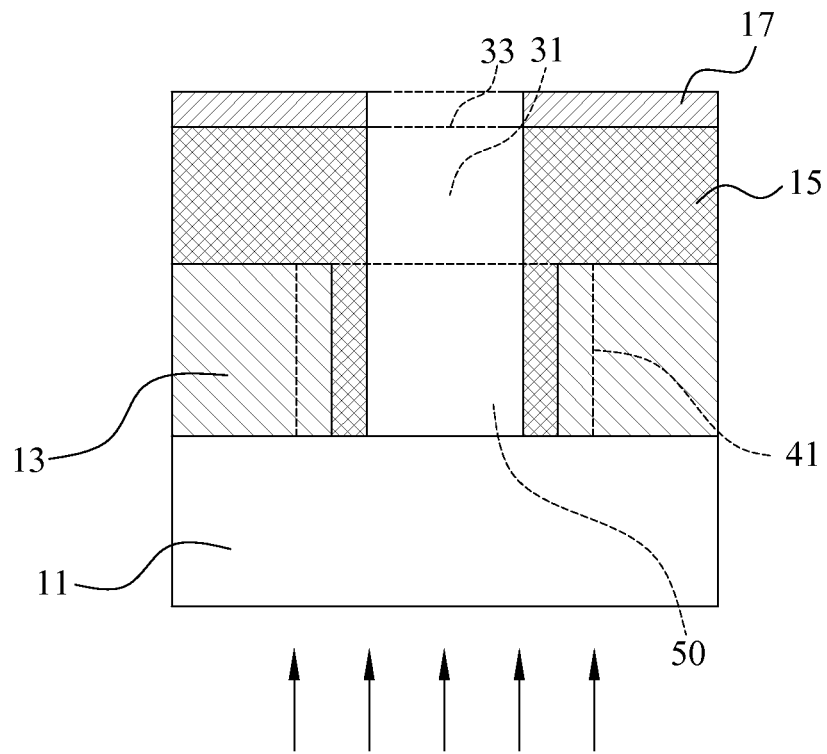

FIG. 3D is schematic cross-sectional view of interlacing or superposing of the second opening trenches with the third opening trenches in the second embodiment of the present invention. Referring to FIG. 3E and an area C4 in FIG. 1, when the second opening trenches 30 and the third opening trenches 40 are interlaced with or superposed one another, the width of the seventh opening patterns 41 is equivalent with the width of the fifth opening patterns 31 and the width of the sixth opening patterns 33.

Referring to FIG. 3E, when the second opening trenches 30 and the third opening trenches are interlaced with or superposed one another in a cross-sectional structure such that the width the seventh opening patterns 41 is longer than the width of the fifth opening patterns 31 and the width of the sixth opening patterns 33. However, the side wall of the seventh opening patterns 41 define parts of the light absorption layer 15 in this case such that a plurality of bottom opening patterns 50 are formed to have the width equivalent to the width of the fifth opening pattern 31 and the width of the sixth opening pattern 33.

The high transmittance thin film solar panel of the present invention is mainly used for green buildings. The opening trenches of the high transmittance thin film solar panel are formed in a manner of curve shape by an oscillating laser head, and can enhance the light transmittance by more than about 3% in comparison with the conventional one. Such a high transmittance thin film solar panel is used to be the material of photoelectric conversion and can enhance the indoor lighting and can be broadly adopted for commercial use.

The preferred embodiments described above are exemplary and explanatory for more understanding of the present invention only, and are not to be taken by way of limitation. It is intended that the present invention covers the modifications and variations of this invention provided they come within the scope of the appended claims and their equivalents.

What is claimed is:

1. A high transmittance thin film solar panel, in a direction of incident light, successively comprising:
    a transparent substrate;
    a front electrode layer disposed on the transparent substrate and formed with at least one first opening pattern and a plurality of seventh opening patterns, wherein the at least one first opening pattern continuously extends in a first direction and defines at least one first separation line;
    a light absorption layer disposed on the front electrode layer and covering the at least one first separation line, the light absorption layer being formed with at least one second opening pattern, at least one third opening pattern, a plurality of fifth opening patterns and a plurality of eighth opening patterns, wherein the at least one second opening pattern and the at least one third opening pattern are parallel to the at least one first opening pattern and extend in the first direction, and the at least one second opening pattern defines at least one second separation line; and
    a rear electrode layer disposed on the light absorption layer and covering the at least one second separation line, the rear electrode layer being formed with at least one fourth opening pattern, a plurality of sixth opening patterns and a plurality of ninth opening patterns, wherein the at least one fourth opening pattern extends in the first direction, and the fourth opening pattern and the at least one third opening pattern have the same width, superpose the same position and cooperatively define at least one first opening trench,
    wherein, the fifth opening patterns and the sixth opening patterns have the same width, superpose the same position and cooperatively define a plurality of second opening trenches; the second opening trenches are continuously and periodically sinusoidal-wave-shaped curves, and extend in a second direction orthogonal to the first direction with amplitude of 10 μm-10 mm and period of 5 μm-500 mm each; the second opening trenches are parallel to and adjacent to each other, and phases of waveforms of two adjacent second opening trenches are in-phase, shifted or 180°-out-of-phase; the seventh opening patterns, the eighth opening patterns and the ninth opening patterns have the same width and superpose the same position, continuously extend and cooperatively define a plurality of third opening trenches; the third opening trenches extend in the second direction, and are parallel to, interlacing with or superposing the second opening trenches; and the light absorption layer is divided into a plurality of areas by the at least one first opening trench, the second opening trenches and the third opening trenches; and
    wherein when the second opening trenches and the third opening trenches interlace with or superpose one another, the width of the seventh opening patterns is longer than the width of the fifth opening patterns and the width of the sixth opening patterns, and side walls of the seventh opening patterns define parts of the light absorption layer such that a plurality of bottom opening patterns formed thereof have a width equivalent to the width of the fifth opening patterns and the width of the sixth opening patterns.

2. The high transmittance thin film solar panel according to claim 1, wherein at least one of the third opening trenches extends in a straight line.

3. The high transmittance thin film solar panel according to claim 1, wherein at least one of the third opening trenches is a periodically sinusoidal-wave-shaped curve with amplitude of 10 μm-10 mm and period of 5 μm-500 mm.

4. The high transmittance thin film solar panel according to claim 1, wherein the transparent substrate is made from one of alkali-free glass, quartz glass and acrylic; the front electrode layer is made from a transparent conductive material; the light absorption layer is made from at least one of mono-crystalline silicon, poly-crystalline silicon, micro-crystalline silicon, CuInGaSe thin film and CuInGaSeS thin film; and the rear electrode layer is made from the transparent conductive material and/or a metallic material.

5. The high transmittance thin film solar panel according to claim 4, wherein the transparent conductive material is selected from one of indium tin oxide and aluminum zinc oxide; the metallic material is selected from one of molybdenum, silver, and nickel.

* * * * *